United States Patent
Davis et al.

(10) Patent No.: US 11,046,576 B1
(45) Date of Patent: Jun. 29, 2021

(54) PRESSURE RELIEF DEVICE FOR MICROPHONE PROTECTION IN AN ELECTRONIC DEVICE AND CORRESPONDING METHODS

(71) Applicant: Motorola Mobility LLC, Chicago, IL (US)

(72) Inventors: Giles Davis, Downers Grove, IL (US); Robert Zurek, Antioch, IL (US); Maninder Sehmbey, Hoffman Estates, IL (US); Martin Pais, North Barrington, IL (US)

(73) Assignee: Motorola Mobility LLC, Chicago, IL (US)

( * ) Notice: Subject to any disclaimer, the term of this patent is extended or adjusted under 35 U.S.C. 154(b) by 28 days.

(21) Appl. No.: 16/703,659

(22) Filed: Dec. 4, 2019

(51) Int. Cl.
| | | |
|---|---|---|
| *H04R 1/02* | (2006.01) | |
| *B81B 7/00* | (2006.01) | |
| *H04R 1/04* | (2006.01) | |
| *H04R 19/04* | (2006.01) | |
| *H04R 3/06* | (2006.01) | |
| *H04R 1/08* | (2006.01) | |

(52) U.S. Cl.
CPC ............ *B81B 7/0019* (2013.01); *H04R 1/04* (2013.01); *H04R 1/086* (2013.01); *H04R 3/06* (2013.01); *H04R 19/04* (2013.01); *B81B 2201/0257* (2013.01); *H04R 2201/003* (2013.01); *H04R 2499/11* (2013.01)

(58) Field of Classification Search
CPC ............ H04R 2410/00; H04R 2499/11; B81B 7/0041
See application file for complete search history.

(56) References Cited

U.S. PATENT DOCUMENTS

| | | | | |
|---|---|---|---|---|
| 8,295,527 | B2 * | 10/2012 | Chen | H04R 1/021 |
| | | | | 381/365 |
| 8,494,577 | B2 * | 7/2013 | Shiogama | H04M 1/035 |
| | | | | 455/550.1 |
| 9,002,037 | B2 * | 4/2015 | Dehe | B81B 7/0029 |
| | | | | 381/174 |
| 9,137,595 | B2 * | 9/2015 | Lee | H04R 1/083 |

(Continued)

FOREIGN PATENT DOCUMENTS

| | | | | |
|---|---|---|---|---|
| WO | WO-2006128956 A1 * | 12/2006 | | H04R 1/44 |
| WO | WO-2009113751 A1 * | 9/2009 | | H04R 1/1091 |

OTHER PUBLICATIONS

Ghanabari, et al., "Polymeric heart valves: new materials, emerging hopes", Published online Apr. 29, 2009; Trends in Biotechnology; Can be viewed at https://doi.org/10.1016/j.tibtech.2009.03.002.

(Continued)

*Primary Examiner* — Ryan Robinson
(74) *Attorney, Agent, or Firm* — Philip H. Burrus, IV

(57) ABSTRACT

An electronic device includes a microphone coupled to a first substrate, a second substrate defining an acoustic port, and a pressure relief device situated between the first substrate and the second substrate. The pressure relief device includes a bore defining an acoustic duct through which the microphone receives acoustic energy from the acoustic port. The pressure relief device also includes a venting section. The venting section breaches the acoustic duct when a pressure within the acoustic duct exceeds a predefined pressure threshold.

20 Claims, 8 Drawing Sheets

(56) References Cited

U.S. PATENT DOCUMENTS

| | | | |
|---|---|---|---|
| 9,185,480 B2 * | 11/2015 | Howes | H04R 1/086 |
| 9,357,299 B2 * | 5/2016 | Kwong | H04R 3/007 |
| 9,363,587 B2 * | 6/2016 | Weiss | H04R 29/001 |
| 9,380,369 B2 * | 6/2016 | Utterman | H04R 1/086 |
| 9,408,009 B1 * | 8/2016 | Witte | H04R 1/44 |
| 9,706,294 B2 * | 7/2017 | Kopetz | H04R 19/04 |
| 9,800,965 B2 | 10/2017 | Miehl et al. | |
| 10,051,363 B2 * | 8/2018 | Clyne | G03B 31/00 |
| 10,212,501 B2 * | 2/2019 | Wang | H04R 1/023 |
| 10,420,406 B2 * | 9/2019 | Lipner | H04R 1/44 |
| 10,771,889 B2 * | 9/2020 | Littrell | H04R 19/005 |
| 2009/0245565 A1 | 10/2009 | Mittleman et al. | |
| 2011/0272769 A1 * | 11/2011 | Song | H04R 31/00 |
| | | | 257/416 |
| 2015/0041931 A1 * | 2/2015 | Szczech | B81B 7/0029 |
| | | | 257/416 |
| 2015/0163572 A1 | 6/2015 | Weiss et al. | |
| 2016/0100256 A1 | 4/2016 | Watson et al. | |
| 2018/0014099 A1 | 1/2018 | Loeppert | |
| 2019/0014421 A1 | 1/2019 | Lim et al. | |
| 2020/0280782 A1 * | 9/2020 | Kleinheincz | H04R 1/086 |
| 2020/0304923 A1 * | 9/2020 | Brioschi | H04R 1/342 |

OTHER PUBLICATIONS

Inventor provided prior art; Pictures of rubber seals; Page Identification U.S. Appl. No. 16/703,659.

"E Shaped Silicone Rubber Seal & Gasket", Published prior to filing of present application; Viewed online Dec. 4, 2019; https://www.accuraterubber.com/extruded-silicone-rubber-gasket-seals/e-shaped-silicone-rubber-seal-gasket/.

Pandolfi, Anna, "Improved Design of Low-Pressure Fluidic Microvalves", Article in Journal of Micromechanics and Microengineering; Published Aug. 2007; pp. 1487-1493.

* cited by examiner

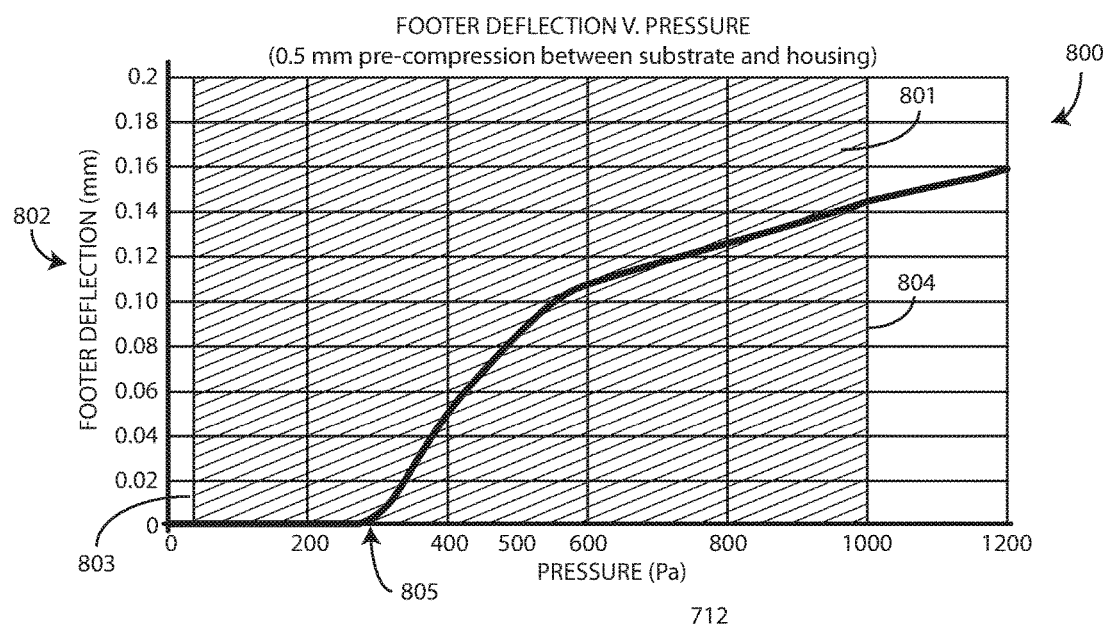
FIG. 8
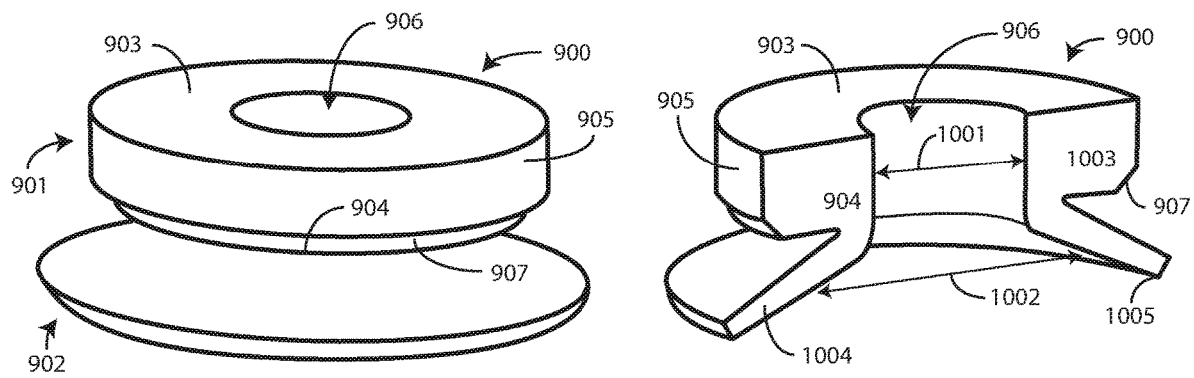
FIG. 9  FIG. 10

PRESSURE RELIEF DEVICE FOR MICROPHONE PROTECTION IN AN ELECTRONIC DEVICE AND CORRESPONDING METHODS

BACKGROUND

Technical Field

This disclosure relates generally to acoustic assemblies, and more particularly to acoustic assemblies in electronic devices.

Background Art

Portable electronic communication devices, such as smartphones and tablet computers, are becoming ubiquitous in society. As the technology employed by these devices has advanced, so too have their feature sets. Modern electronic devices have evolved to become feature-rich with ever increasing levels of hardware and software integration to become lighter, thinner, and more highly-functional computing devices. To meet these ever increasing demands, many components used in such devices are becoming smaller and thinner They therefore risk being damaged by drops due to the fact that many electronic devices are handheld. It would be advantageous to have systems and methods to better protect sensitive components integrated into modern electronic devices.

BRIEF DESCRIPTION OF THE DRAWINGS

FIG. 8 illustrates a graph illustrating breaching of an acoustic duct as a function of pressure in accordance with one or more embodiments.

FIG. 9 illustrates an alternate pressure relief device in accordance with one or more embodiments of the disclosure.

FIG. 10 illustrates a sectional view of an alternate pressure relief device in accordance with one or more embodiments of the disclosure.

Figure 1:
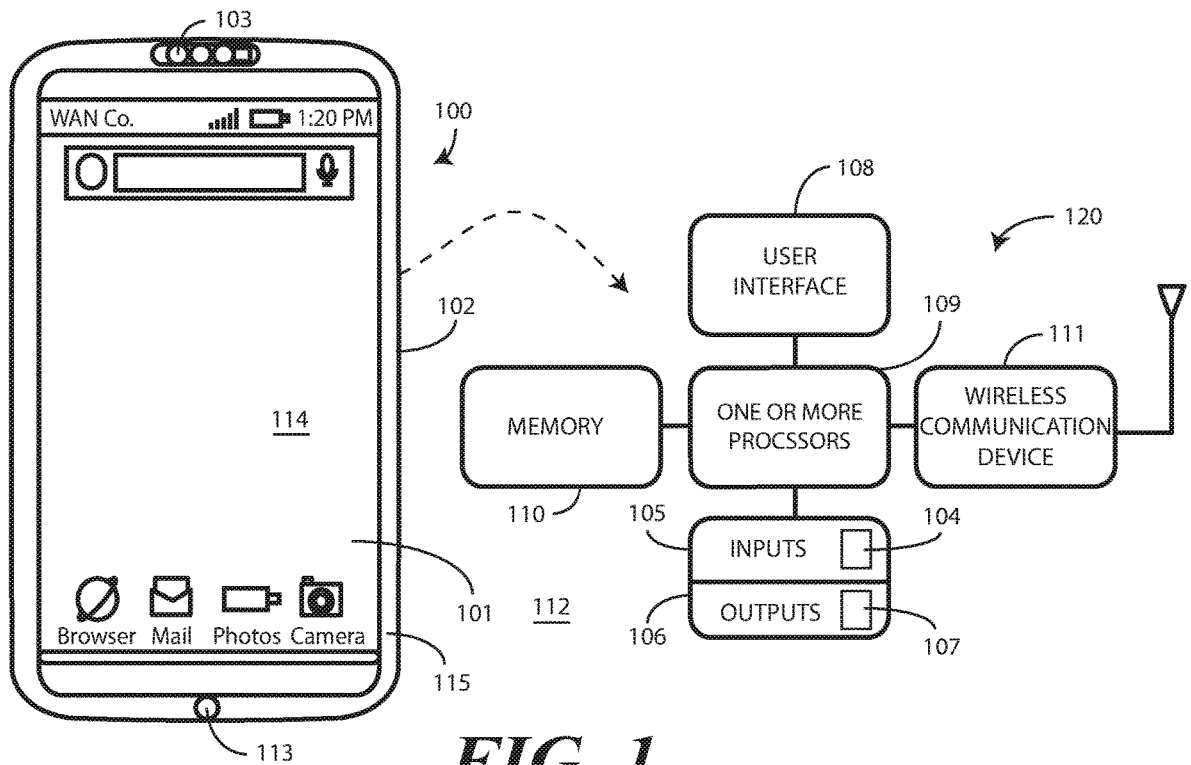
FIG. 1 illustrates one explanatory electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, the terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within one percent and in another embodiment within 0.5 percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

As noted above, the handheld, mobile nature of many modern electronic devices renders them susceptible to drops and falls. To protect sensitive components operating within the electronic device, embodiments of the disclosure contemplate that it is advantageous to increase the structural robustness of such devices whenever possible. In looking at the audio input circuits of many electronic devices such as smartphones, the microphone assemblies are incredibly small, with most being sub-millimeter in size, using diaphragms that are only a few microns thick. These diaphragms, which are generally manufactured from semiconductor materials, are frequently exposed to the environment surrounding the electronic device through one or more acoustic ports defined by the housing.

This exposure presents structural risks for the microphone, and in particular, the diaphragm of the microphone. When an electronic device, such as a smartphone, is dropped with a major or minor face of the electronic device abutting a flat surface, such as a floor, table, or counter top, an aerodynamic based pressure pulse can be created. In such conditions, two things occur: first, the electronic device—and the corresponding microphone assembly—receive a significant mechanical shock from the impact. Second, and more importantly for the microphone assembly, an aerodynamic-based pressure pulse is induced in the chamber between the acoustic port of the housing and the diaphragm of the microphone. This aerodynamic based pressure pulse can traverse through the acoustic port and associated conduit to the microphone. This pressure pulse results from air being progressively trapped between the impact surface and the diaphragm of the microphone. In severe cases, the aerodynamic based pressure pulse imposes its destructive forces on the diaphragm. The pressure generated within this chamber can surpass magnitudes on the order of thirty-six atmospheres or five hundred pounds per square inch.

Under such loads, the diaphragm of the microphone assembly can be damaged, with its functionality compromised or rendered inoperable. The back plate of the diaphragm can crack, strain, or even completely break. The transducer membrane can be damaged as well.

Embodiments of the disclosure provide a solution to this problem by providing a pressure relief device that can be situated between a first substrate and a second substrate defining an acoustic port. In one or more embodiments, a microphone is coupled to the first substrate. The second substrate can be a device housing of an electronic device, a printed circuit board, or other type of substrate.

In one or more embodiments, the pressure relief device comprises a bore defining an acoustic duct through which the microphone receives acoustic energy from the acoustic port. In one or more embodiments, the pressure relief device comprises a venting section. The venting section can be situated on a surface of the pressure relief device extending from the first substrate to the second substrate in one embodiment. In another embodiment, the venting section can extend distally away from a base section. In one embodiment, the venting section comprises an arcuate leg. In another embodiment, the venting section comprises a straight leg extending distally away from the base section.

In one or more embodiments, the pressure relief device is manufactured from an elastomeric material and is compressed by a loading force applied by the first substrate and second substrate by a predefined compression distance or percentage. In one or more embodiments, when the pressure in the acoustic duct exceeds a predefined pressure threshold, the venting section breaches the acoustic duct to protect the microphone from mechanical damage resulting from the aerodynamic-based pressure pulse that may be induced in the acoustic duct due to situations where the electronic device is dropped on a surface that impacts the acoustic port of the second substrate with the direction of impact being oriented normally with the acoustic port.

In one or more embodiments, the venting section initially breaches when the pressure in the acoustic port is within a predefined pressure threshold window. This pressure threshold window is bounded on the lower end by the maximum desired acoustic signal to be recorded by the microphone, and on the upper end by a pressure that will damage the microphone. A maximum desired acoustic signal level will generally be between 120 decibels (dB) sound pressure level (SPL) and 135 dB SPL, which corresponds to pressure of between about 20 and 112.5 Pascals (Pa). In one or more embodiments, the predefined pressure window has a lower pressure threshold boundary of about twenty Pascals, and an upper pressure threshold boundary of about 1000 Pascals. In one or more embodiments, the venting section initially breaches at an initial breach pressure threshold within this predefined pressure threshold window, and continues breaching the acoustic duct until the pressure within the acoustic duct falls below this initial breach pressure threshold, thereby preventing mechanical damage to the microphone from the aerodynamic-based pressure pulse induced in the acoustic duct due to dropping the electronic device or other phenomena.

Accordingly, embodiments of the disclosure provide a pressure relief device with a venting section that has a propensity to deform under internal air pressure to relieve the onset of an accumulating pressure pulse within the acoustic chamber above a predefined pressure threshold. Advantageously, the pressure relief device can be used with a variety of microphone assemblies, thereby not limiting its use to any particular type of sensor. Moreover, pressure relief devices configured in accordance with embodiments of the disclosure further preserve the acoustic performance offered by the microphone as well.

Turning now to FIG. 1, illustrated therein is one explanatory electronic device 100 configured in accordance with one or more embodiments of the disclosure. For illustration purposes, the electronic device 100 of FIG. 1 is configured as a smartphone. Embodiments of the disclosure contemplate that the electronic device 100 could be configured as other devices as well, including as a tablet computer, a dedicated voice assistant device, a gaming device, a multimedia device, or other device. Other types of electronic devices will be obvious to those of ordinary skill in the art having the benefit of this disclosure.

The electronic device 100 of FIG. 1 includes a display 101, which may optionally be touch-sensitive. In an embodiment where the display 101 is touch-sensitive, users can deliver user input to the display 101 as touch input from a finger, stylus, or other objects disposed proximately with the display 101. In one embodiment, the display 101 is configured as an active matrix organic light emitting diode display. However, it should be noted that other types of displays, including liquid crystal displays, would be obvious to those of ordinary skill in the art having the benefit of this disclosure.

The explanatory electronic device 100 of FIG. 1 includes a housing 102. In one or more embodiments, the housing 102 is defined by one or more substrates configured as housing members. In the illustrative embodiment of FIG. 1, the housing 102 includes a first housing member 115 that surrounds the display 101. In the illustrative embodiment of FIG. 1, the first housing member 115 defines the side and rear surfaces of the electronic device 100. In other embodiments, the first housing member 115 will define only the sides of the electronic device 100, while a second housing member defines the rear surface of the electronic device 100.

In the illustrative embodiment of FIG. 1, the housing 102 also includes another housing member configured as a fascia 114. In one or more embodiments, the fascia 114 is disposed atop the display 101 to protect the display 101 from damage. In one or more embodiments, the fascia 114 comprises an optically transparent substrate. In the illustrative embodiment of FIG. 1, the fascia 114 defines a front major face of the housing 102 that is disposed above the display 101.

In one or more embodiments, the optically transparent substrate defining the fascia 114 may be manufactured from an optically transparent material such as glass, soda glass, reinforced glass, plastic, or a thin film sheet. In one or more embodiments the optically transparent substrate functions as the fascia 114 by defining a cover for a major surface of the housing 102. In one or more embodiments the fascia 114 is optically transparent, in that light can pass through the fascia 114 so that objects behind the fascia 114, e.g., the display 101, can be distinctly seen. In one or more embodiments, the fascia 114 can comprise reinforced glass strengthened by a process such as a chemical or heat treatment.

Figure 2:
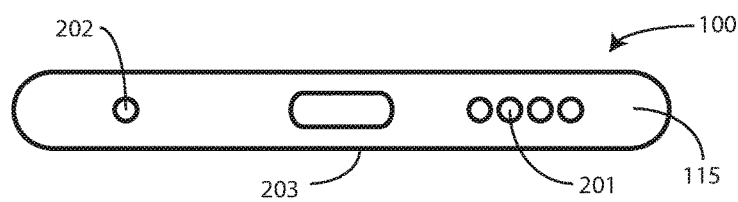
FIG. 2 illustrates an end view of one explanatory electronic device in accordance with one or more embodiments of the disclosure.

Features can be incorporated into the housing 102. These features can be located along one or more of the housing members, e.g., first housing member 115, the fascia 114, or a rear housing member (where included), that collectively define the housing 102. Examples of such features include a front-facing camera or imager 103, a rear-facing camera or imager, one or more microphones 104, and/or an optional speaker port (shown as element 201 in FIG. 2). User interface components, which may be configured as a button, touch sensor, or touch sensitive surface, can also be disposed along housing members defining the housing 102.

Also illustrated in FIG. 1 is one explanatory block diagram schematic 120 of the electronic device 100. In one or more embodiments, the block diagram schematic 120 is configured as a printed circuit board assembly disposed within the housing 102 of the electronic device 100. Various components can be electrically coupled together by conductors or a bus disposed along one or more printed circuit boards. It should be noted that the block diagram schematic 120 includes many components that are optional, but which are included in an effort to demonstrate how varied electronic devices configured in accordance with embodiments of the disclosure can be.

Illustrating by example, in one or more embodiments the electronic device 100 includes an audio input device 105 to receive audio input via one or more microphones 104 and an audio output device 106 to deliver audio output via one or more loudspeakers 107. Where the electronic device 100 is configured to be purely a voice assistant device, the display 101 would be optional, in that it is not required for this voice-based user interaction. Thus, it is to be understood that the block diagram schematic 120 of FIG. 1 is provided for illustrative purposes only and for illustrating components of one electronic device 100 in accordance with embodiments of the disclosure.

The block diagram schematic 120 of FIG. 1 is not intended to be a complete schematic diagram of the various components required for an electronic device 100. Therefore, other electronic devices in accordance with embodiments of the disclosure may include various other components not shown in FIG. 1, or may include a combination of two or more components or a division of a particular component into two or more separate components, and still be within the scope of the present disclosure.

The illustrative block diagram schematic 120 includes a user interface 108. In one or more embodiments, the user interface 108 includes the display 101 and one or more other sensors, which may include a touch sensor, proximity sensor, depth imager, or other type of sensor.

In one embodiment, the electronic device 100 includes one or more processors 109. In one embodiment, the one or more processors 109 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the block diagram schematic 120. Each of the application processor and the auxiliary processor(s) can be configured to process and execute executable software code to perform the various functions of the electronic device 100 with which the block diagram schematic 120 operates. A storage device, such as memory 110, can optionally store the executable software code used by the one or more processors 109 during operation.

In this illustrative embodiment, the block diagram schematic 120 also includes a communication circuit 111 that can be configured for wired or wireless communication with one or more other devices or networks. The networks can include a wide area network, a local area network, and/or personal area network. The communication circuit 111 may also utilize wireless technology for communication, such as, but are not limited to, peer-to-peer or ad hoc communications and other forms of wireless communication such as infrared technology. The communication circuit 111 can include wireless communication circuitry, one of a receiver, a transmitter, or transceiver, and one or more antennas.

In one embodiment, the one or more processors 109 can be responsible for performing the primary functions of the electronic device with which the block diagram schematic 120 is operational. For example, in one embodiment the one or more processors 109 comprise one or more circuits operable with the user interface 108 to present presentation information to a user. Additionally, the one or more processors 109 can be operable with the audio output device 106 to deliver audio output to a user. The executable software code used by the one or more processors 109 can be configured as one or more modules that are operable with the one or more processors 109. Such modules can store instructions, control algorithms, and so forth.

In one or more embodiments, the audio input device 105 is operable to receive audio input via the one or more microphones 104 from a source, such as a person or persons, who are situated within an environment 112 about the electronic device 100. The audio input device 105 can also receive audio input via the one or more microphones 104 from the environment 112 as well. The audio input device 105 can include hardware, executable code, and speech monitor executable code in one embodiment.

In one or more embodiments, the one or more microphones 104 are coupled to a substrate situated within the electronic device 100, but are exposed to the environment 112 by an acoustic port defined in the housing 102. In the illustrative embodiment of FIG. 1, the acoustic port 113 can be defined in any of the substrates configured as housing members that define the housing 102 of the electronic device 100. For example, in FIG. 1 the acoustic port 113 exposing the one or more microphones 104 is defined in the fascia 114, which is substantially flat and defines the front, major face of the electronic device 100. By contrast, in FIG. 2 an acoustic port 202 is defined in the first housing member 115 defining the side faces, or minor faces, of the electronic device 100. In still other embodiments, the acoustic port could be defined in the rear major face 203 of the electronic device 100 as well.

Regardless of where defined, the diameter of the acoustic port 113,202 can vary. In one or more embodiments, the diameter of the acoustic port 113,202 is between 0.5 millimeters and 1.5 millimeters. In one embodiment, the diameter of the acoustic port 113,202 is between 0.5 millimeters and 1.0 millimeters. In one embodiment, the diameter of the acoustic port 113,202 is about 0.8 millimeters. These diameters are illustrative only. Other diameters for the acoustic port 113,202 will be obvious to those of ordinary skill in the art having the benefit of this disclosure.

Figure 3:
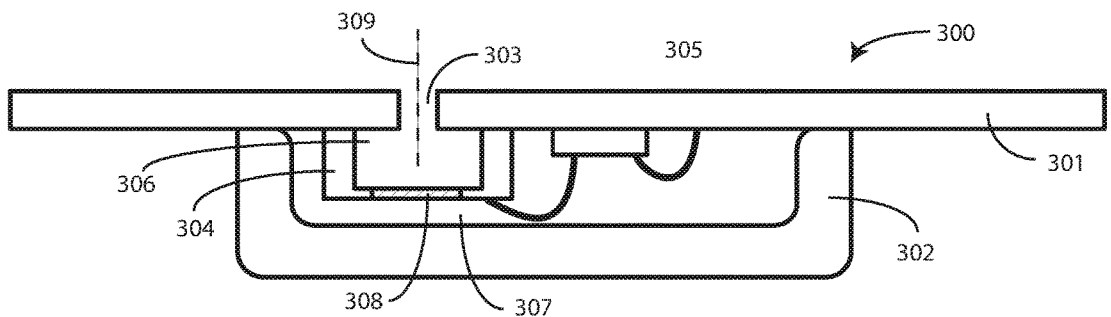
FIG. 3 illustrates a prior art microphone assembly.

Turning now to FIG. 3, illustrated therein is one illustrative prior art microphone assembly 300 with which a pressure relief device, examples of which will be described in more detail below, can be used in accordance with embodiments of the disclosure. The illustrative microphone assembly 300 of FIG. 3 employs a microelectromechanical system (MEMS) microphone. Such microphones are routinely used in various devices, including tablet computers, laptop computers, gaming devices, mobile phones, smartphones, and other devices.

It should be noted that the prior art microphone assembly 300 of FIG. 3 is merely one example of a microphone assembly with which pressure relief devices configured in accordance with embodiments of the disclosure may be used. As noted above, one of the principal advantages offered by embodiments of the disclosure include the fact that pressure relief devices configured in accordance with embodiments of the disclosure can be used with a variety of microphone assemblies.

Thus, it is to be understood that embodiments of the disclosure are not limited in their usage to the prior art microphone assembly 300 of FIG. 3, which is merely provided for illustrative purposes. Other examples of microphone assemblies suitable for use with pressure relief devices configured in accordance with the disclosure will be obvious to those of ordinary skill in the art having the benefit of this disclosure. To be sure, pressure relief devices configured in accordance with embodiments of the disclosure can be used with a wide variety of microphone sensors. As noted above, pressure relief devices configured in accordance with embodiments of the disclosure work to preserve the acoustic performance offered by the microphone assembly with which they are used, regardless of type.

In the illustrative embodiment of FIG. 3, the microphone assembly 300 comprises a substrate 301 and a cover or "can" 302. In one or more embodiments, the can 302 comprises a metal or metallized substrate that serves as an electromagnetic shield for the microphone housed within the can 302. In one or more embodiments, the can 302 is sealed to the substrate 301 to create an airtight seal between the two. This seal can be created when the can 302 is soldered, epoxied, or otherwise coupled to the substrate 301.

In one or more embodiments, the substrate 301 is configured as a printed wiring board and comprises a plurality of layers manufactured out of an FR4 material. In other embodiments, the substrate 301 can be configured another arrangement of layers. In one or more embodiments, the substrate 301 defines a substantially planar, rigid surface to which elements such as the can 302 can be soldered or otherwise attached.

In one or more embodiments, the substrate 301 is configured as two or more substrates, one an integral part of the microphone assembly 300, and another a separate substrate 301 that the microphone is attached to by means such as soldering. In these embodiments, the second substrate 301 abuts the pressure relief device (400), described below with reference to FIG. 4, thereby forming a seal at the intersection of the pressure relief device (400) and the second substrate 301 to allow air to pass from the environment (112) into the microphone assembly 300.

In one or more embodiments, the substrate 301 can comprise features that allow electrical or mechanical components to be coupled thereto. For example, the substrate 301 can include one or more copper layers, one or more solder masks, one or more vias passing through the various layers defining the substrate 301, or other features. While this is one configuration for the substrate 301, others are possible as well. Illustrating by example, the substrate 301 can be configured as any of a rigid fiber reinforced resin substrate, a flexible substrate, a rigid/flex combination substrate, or other type of substrate.

In the illustrative embodiment of FIG. 3, the substrate 301 defines an acoustic port 303. In one or more embodiments, the acoustic port 303 has a diameter of about 0.25 millimeters. However, other diameters for the acoustic port 303 will be obvious to those of ordinary skill in the art having the benefit of this disclosure.

The acoustic port 303 allows acoustic energy to pass through the substrate 301 and into the can 302. The can 302 can be soldered to one or more solder pads disposed along the substrate 301 in one or more embodiments.

Situated within the can 302 are a MEMS die 304 and an application specific integrated circuit 305. Wires or other electrical conductors can be used to couple the components together. For example, wires can be used to couple the MEMS die 304 to the application specific integrated circuit 305, or the MEMS die 304 and/or the application specific integrated circuit 305 to the substrate 301. When the MEMS die 304 is coupled to the substrate 301 within the can 302, an acoustic front volume 306 and an acoustic back volume 307 are defined about the diaphragm 308 of the microphone assembly 300.

When operational, acoustic energy enters the acoustic port 303. This acoustic energy moves the diaphragm 308 on the MEMS die 304. In one or more embodiments, the diaphragm 308 is manufactured from a semiconductor material such that its movement creates a changing capacitance between the back plate and the diaphragm 308. The application specific integrated circuit 305 detects this changing capacitance, processing the same to convert the capacitance to acoustic voltage signals suitable for usage by an audio input device (105) of an electronic device (100). Alternatively other embodiments of microphones may create a changing voltage potential directly that is amplified by the application specific integrated circuit 305 to convert the voltage to acoustic signals suitable for usage by an audio input device (105) of an electronic device (100).

When the microphone assembly 300 is incorporated into an electronic device (100), the acoustic port 303 of the microphone assembly 300 is exposed to the environment (112) of the electronic device (100) through the acoustic port (113,202) defined in the housing (102). As discussed above, the microphone assembly 300 is configured as a very small part. For instance, the diaphragm 308, shown in an exaggeratedly large view for illustration in FIG. 3, may be only a few microns thick. The back plate can have a similar thickness.

The exposure of these sensitive components through the acoustic port 303 in the substrate 301 and the acoustic port (113,202) defined in the housing 102 of an electronic device 100 presents structural risks for the microphone assembly 300, and in particular, the diaphragm 308 of the microphone assembly 300. When the electronic device (100) housing the microphone assembly 300 is dropped, optionally with an axis 309 of the acoustic port 303 in the substrate 301 and the acoustic port (113,202) defined in the housing 102 of an electronic device 100 oriented normally with the impact surface or otherwise, damage to the diaphragm 308, back plate, or other components of the microphone assembly can occur. This damage can be due to the significant mechanical shock received from the impact. However, more frequently, the introduction of an aerodynamic-based pressure pulse into the front volume 306 from the acoustic port 303 in the substrate 301 and the acoustic port (113,202) defined in the housing 102 of an electronic device 100 from air being progressively trapped between the impact surface and the diaphragm 308 of the microphone assembly 300 can be particularly destructive.

The pressure generated within the front volume 306 can surpass magnitudes on the order of thirty-six atmospheres or five hundred pounds per square inch. Under such loads, the diaphragm 308 of the microphone assembly 300 can be damaged, with its functionality compromised or rendered inoperable. The back plate of the diaphragm 308 can crack, strain, or even completely break. The transducer membrane of the diaphragm 308 can be damaged as well.

Embodiments of the disclosure provide a solution to this problem by providing a pressure relief device that can be situated between a first substrate and a second substrate defining an acoustic port. The pressure relief device can include a venting section that deforms, deflects, or otherwise changes shape when pressure within the acoustic duct system leading to the front volume 306 exceeds a predefined pressure threshold. This deformation or deflection relieves the onset of an accumulating pressure pulse within the front volume 306, thereby sparing the diaphragm 308 or other microphone assembly components from damage.

Figure 4:
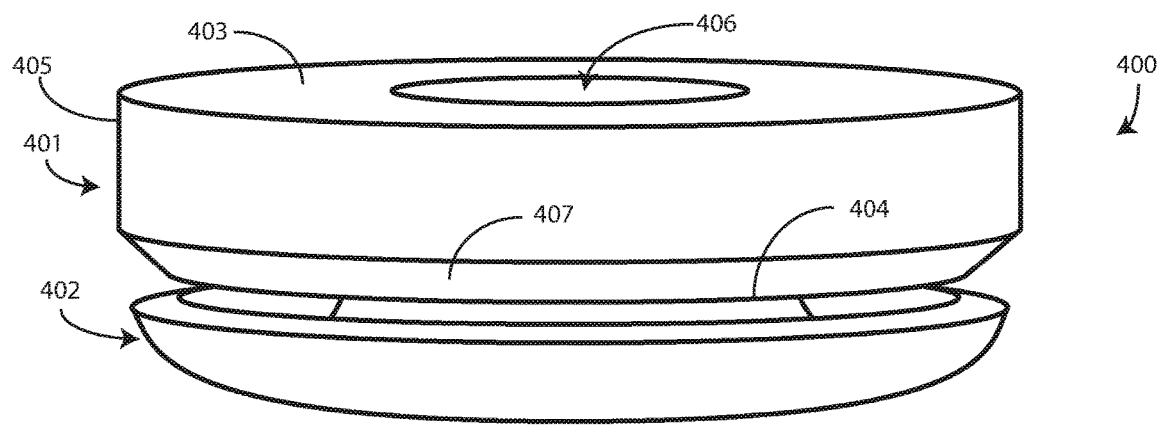
FIG. 4 illustrates one explanatory pressure relief device in accordance with one or more embodiments of the disclosure.
Figure 5:
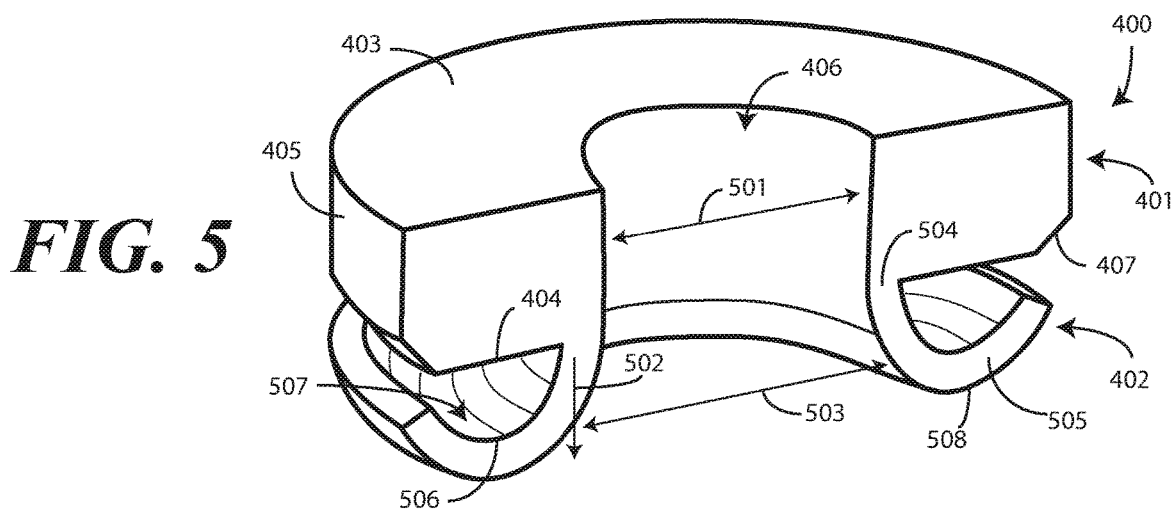
FIG. 5 illustrates a sectional view of one explanatory pressure relief device in accordance with one or more embodiments of the disclosure.

Turning now to FIGS. 4-5, illustrated therein is one illustrative pressure relief device 400 configured in accordance with one or more embodiments of the disclosure. FIG. 4 illustrates a perspective view of the pressure relief device 400, while FIG. 5 illustrates a sectional view of the pressure relief device 500.

In one or more embodiments, the pressure relief device 400 comprises a base section 401 and a venting section 402. In this illustrative embodiment, the base section 401 is configured as a cylinder having a first major face 403, a second major face 404, and a minor face 405. In this illustrative embodiment, the first major face 403 and the second major face 404 are substantially planar, while the minor face 405 defines a perimeter of the base section 401. In this illustrative embodiment, the base section 401 includes a chamfer 407 between its surface and the second major face 404.

While a cylinder is one suitable geometry for the base section 401, it should be noted that embodiments of the disclosure are not so limited. In other embodiments, the perimeter of the base section 401 can take other shapes depending upon application, including three-sided shapes, four-sided shapes, five or more sided shapes, or free-form shapes. Other shapes for the perimeter of the base section 401 will be obvious to those of ordinary skill in the art having the benefit of this disclosure.

As shown in FIGS. 4-5, in one or more embodiments the base section 401 defines a bore 406. In this illustrative embodiment, the bore 406 takes the same shape as the perimeter of the base section 401, which is substantially cylindrical with a predefined diameter 501. However, in other embodiments the bore 406 can take other shapes as well. As with the perimeter of the base section, the interior surface of the bore 406 can be a three-sided shape, a four-sided shape, a five or more sided shape, or a free-form shape. In one or more embodiments, the perimeter of the base section 401 and the inner surface of the bore 406 have the same shape, as shown in FIGS. 4-5. In other embodiments, the perimeter of the base section 401 and the inner surface of the bore 406 have different shapes.

In one or more embodiments, the pressure relief device 400 also includes a venting section 402. In one or more embodiments, the venting section extends 402 distally away from a major face 404 of the base section 401. In this illustrative embodiment, the base section 401 and the venting section 402 are manufactured as a singular, unitary part from an elastomeric material such as a thermoplastic elastomer.

However, in other embodiments the base section 401 and the venting section 402 could be manufactured as separate components that are bonded together, coupled together, or otherwise attached so as not to fall apart such that different materials could be used for the base section 401 and the venting section 402. For example, the base section 401 could be bonded to the venting section 402 by adhesive bonding in one embodiment. The base section 401 can be thermally or sonically welded to venting section 402 in another embodiment. The base section 401 and the venting section 402 could be manufactured from different materials by way of a two-shot injection molding process where each part is formed by a shot sequence into a mold to bond the materials together. Other techniques for manufacturing the pressure relief device 400 will be obvious to those of ordinary skill in the art having the benefit of this disclosure.

As shown in FIGS. 4-5, in one or more embodiments the bore 406 extends from the base section 401 through the venting section 402. In this illustrative embodiment, the diameter 501 of the bore 406 within the base section 401 is narrower than is the diameter 503 of the bore 406 within the venting section 402. In one or more embodiments, this is due to the fact that the venting section 402 couples to the base section 401 at a periphery 504 of the bore 406. The venting section 402 then extends 502 distally away from the base section 401 in a direction that flares outward from the periphery 504 of the bore 406. This causes the diameter 503 of the bore 406 within the venting section 402 to get larger as the venting section 402 extends 502 distally away from the major face 404 of the base section 401.

In the illustrative embodiment of FIGS. 4-5, the venting section 402 defines an arcuate leg 505 that is curved or bow-shaped. In this illustrative embodiment, the arcuate leg 505 defines a concave surface 506 that is separated from the major face 404 from which the arcuate leg 505 extends by an air gap 507. The arcuate leg 505 also defines a convex surface 508. As will be shown in more detail below with reference to FIG. 7, in one or more embodiments the pressure relief device 400 can be situated between a first substrate, which can be a housing member, printed circuit board, or other substrate, and a second substrate, which can be a printed circuit board, can, or other substrate. Where so situated, the first major face 403 abuts the first substrate, while the convex surface 508 of the arcuate leg 505 abuts the second substrate in one or more embodiments.

Figure 6:
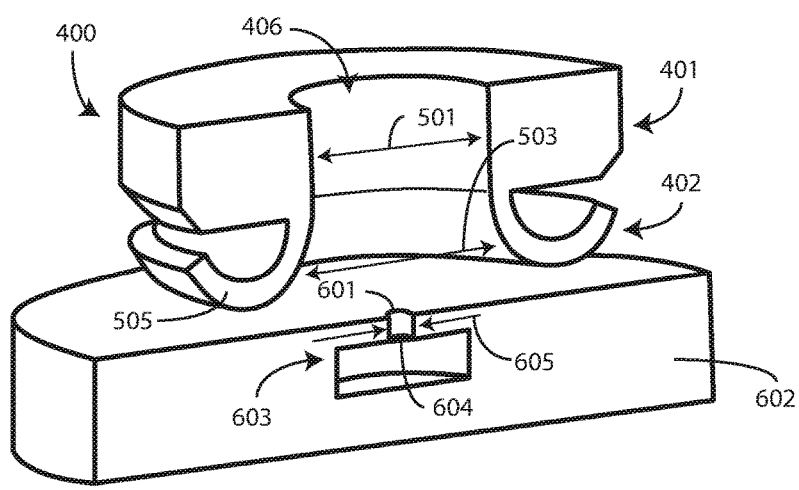
FIG. 6 illustrates one explanatory acoustic assembly in accordance with one or more embodiments of the disclosure.

Turning now to FIG. 6, in one or more embodiments the pressure relief device 400 can be positioned such that the bore 406 surrounds the acoustic port 601 of a substrate 602 leading to a microphone assembly 603. Where so situated, the bore 406 defines an acoustic duct leading to the acoustic port 601 of a substrate 602, with the diaphragm 604 of the microphone assembly 603 receiving acoustic energy through the acoustic duct.

In this illustrative embodiment, the bore 406 has a diameter 501 that is much wider than the diameter 605 of the acoustic port 601 of the substrate 602. In one or more embodiments, the diameter 501 of the bore 406 is at least five times greater than the diameter 605 of the acoustic port 601 of the substrate 602. Illustrating by example, in one or more embodiments the diameter 605 of the acoustic port 601 of the substrate 602 is between 0.2 and 0.3 millimeters. In one embodiment, the diameter 605 of the acoustic port 601 of the substrate 602 is about 0.25 millimeters. By contrast, in one or more embodiments the diameter 501 of the bore 406 within the base section 401 of the pressure relief device 400 is between 1.3 and 1.5 millimeters. In one embodiment, the diameter 501 of the bore 406 of the pressure relief device 400 within the base section 401 is about 1.4 millimeters. As previously, described, the diameter 503 of the bore 406 within the venting section 402 is even larger in this illustrative embodiment.

In one or more embodiments, the pressure relief device 400 and the substrate 602 can be composed of one or more laminated layers. Each of these layers can have different sized or shaped bores creating bores and ports that are not constant shape or diameter along their length. In these embodiments, the bore 406, and acoustic port 601 would be comprised of stepped shapes along their length.

In one or more embodiments, when the pressure in the acoustic duct exceeds a predefined pressure threshold, the venting section 402 breaches the acoustic duct when the arcuate leg 505 deflects, thereby causing separation between the substrate 602 and the pressure relief device 400. This separation allows air or gas to pass between the venting section 402 and the substrate 602 into the interior of the electronic device in which the assembly is integrated. This venting function protects the diaphragm 604 of the microphone assembly from mechanical damage resulting from the aerodynamic-based pressure pulse. These damaging pulses may be induced in the acoustic duct in situations where the electronic device in which the assembly is integrated is dropped on a surface with a major or minor face of the electronic device abutting a flat surface.

Figure 7:
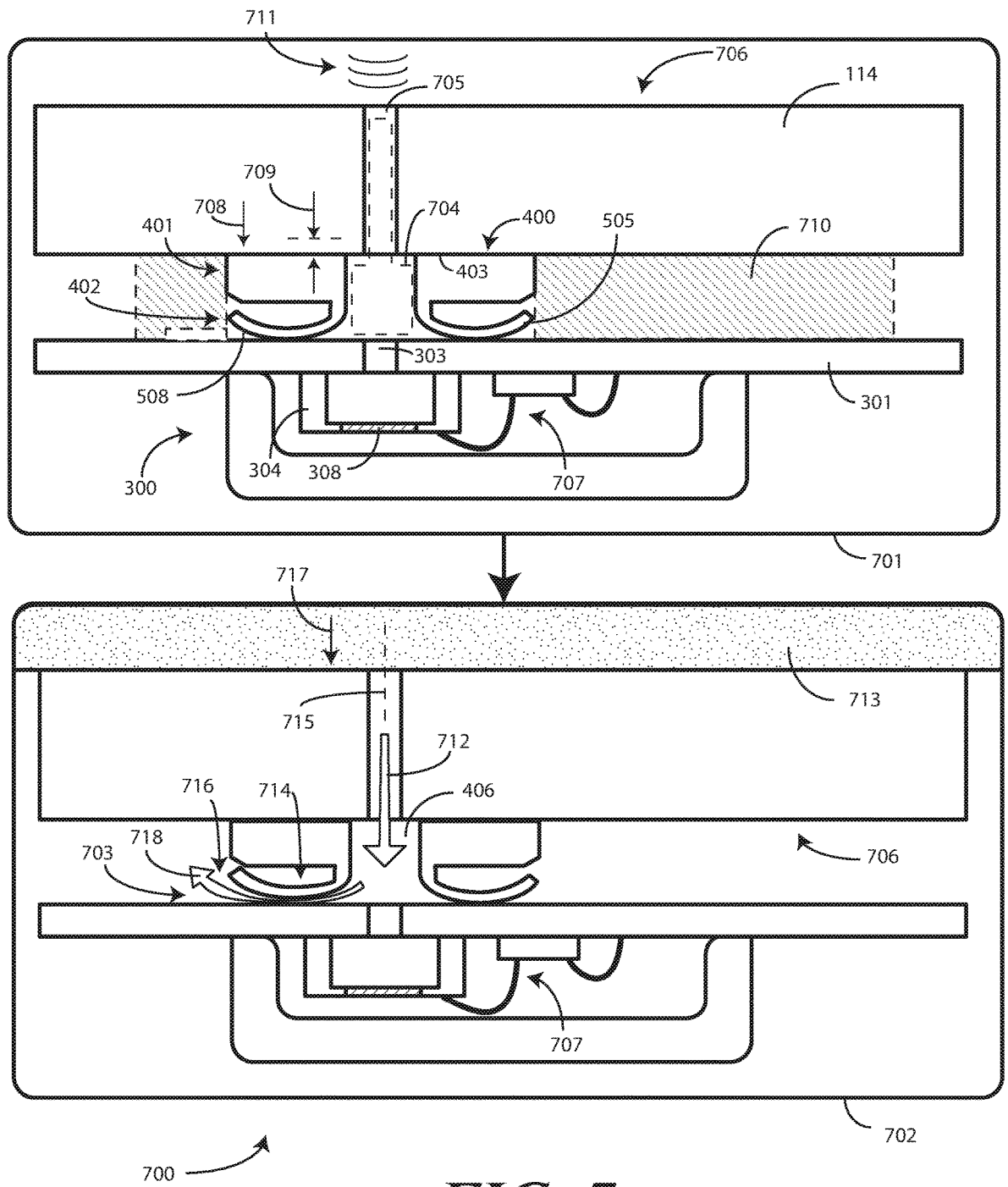
FIG. 7 illustrates one or more method steps in accordance with one or more embodiments of the disclosure.

Turning now to FIG. 7, illustrated therein is this process in more detail. FIG. 7 illustrates one explanatory method 700 in an electronic device (100) of initially breaches 703 an acoustic duct 704 defined by a bore 406 of a pressure relief device 400 situated between a microphone assembly 300 coupled to a first substrate 301 and an acoustic port 705 defined in a second substrate 706 when a pressure 712 within the acoustic duct 704 falls within a predefined pressure window (described below with reference to FIG. 8). The method 700 further continues the breaching 703 when the pressure 712 exceeds an upper pressure threshold boundary of the predefined pressure threshold window, with the breaching 703 continuing until the pressure 712 falls below the initial breach pressure threshold at which the breaching 703 commenced. This method 700 thus prevents mechanical damage to the microphone assembly 300 from the pressure 712.

At step 701, a microphone assembly 300 including a microphone 707 having a MEMS die 304 comprising a diaphragm 308 and a back plate is coupled to a first substrate 301. As previously described, the substrate 301 in this illustrative example is a printed wiring board. In this example, the substrate 301 defines an acoustic port 303.

A second substrate 706 then defines another acoustic port 705. In this illustrative embodiment the second substrate comprises a housing member of the electronic device (100), and in particular a substantially flat front fascia 114 of the electronic device (100). As shown in FIG. 1 above, this fascia 114 defines a major face of the electronic device (100) in one or more embodiments.

The pressure relief device 400 of FIGS. 4-5 above is situated between the first substrate 301 and the second substrate 706, which puts the first substrate 301 situated between the microphone 707 of the microphone assembly 300 and the pressure relief device 400. The pressure relief device 400 comprises a bore 406 that defines an acoustic duct 704 through which the microphone 707 of the microphone assembly 300 receives acoustic energy 711 from the acoustic port 705 of the second substrate 706 and, in this example, from the acoustic port 303 of the first substrate 301.

As before, in this embodiment the pressure relief device 400 includes a base section 401 and a venting section 402 extending distally away from the base section 401. The venting section 402 of this embodiment defines an arcuate leg 505. The arcuate leg 505 defines a convex surface 508 that abuts the first substrate 301. The major face 403 of the base section 401 disposed opposite the base section 401 from the venting section 402 abuts the second substrate 706. As previously described, the bore 406 is narrower within the base section 401 than in the venting section 402 in this illustrative embodiment.

In this illustrative embodiment, the pressure relief device 400 is manufactured from an elastomeric material. Additionally, the first substrate 301 and the second substrate 706 apply a loading force 708 to compress the pressure relief device 400 by a predefined compression amount or predefined compression distance 709. In one or more embodiments, the predefined compression distance 709 is between 0 and 0.1 millimeters. For example, in one embodiment the predefined compression distance 709 is about 0.05 millimeters.

A stabilizing material 710 can be placed to either side or, or such that it surrounds, the pressure relief device 400 to prevent lateral translation of the pressure relief device 400. In other embodiments, this stabilizing material 710 will be omitted as the loading force 708 functions to retain the elastomeric material of the pressure relief device 400 in place by mechanical friction.

At step 702, an impact surface 713 has impacted the second substrate 706. In this example, the direction 717 of impact is oriented normally with a central axis 715 of the acoustic duct 704. As noted above, this "face plant" type of impact, which can occur when the electronic device (100) is dropped, causes an aerodynamic-based pressure pulse to be induced in the acoustic duct 704, which causes the pressure 712 to exceed a predefined pressure threshold. In one or more embodiments, the predefined pressure threshold is between 20 and 1000 Pascals, inclusive. In one or more embodiments, this predefined pressure threshold is bounded by the maximum desired acoustic signal pressure on the lower end and a higher pressure that is above the maximum desired acoustic pressure but below the failure point of the microphone on the upper end, as noted above.

In one or more embodiments, the venting section 402 then breaches 703 the acoustic duct 704 when the pressure 712 exceeds this predefined threshold. In one or more embodiments, the breaching 703 comprises deforming at least a portion 714 of the venting section 402 situated between the first substrate 301 and the second substrate 706. In this example, the breaching 703 comprises deforming the arcuate leg 505 extending distally away from the base section 401 of the pressure relief device 400.

As shown at step 702, in this example the left side of the venting section 402 deforms such that a portion of the convex surface 508 of the arcuate leg 505 separates from the first substrate 301 to allow gas 718 to escape the acoustic duct 704 and pass into the interior of the electronic device (100) between the first substrate 301 and the second substrate 706. In one or more embodiments, this passage way between the first substrate 301 and the second substrate 706 effectively establishes a second acoustic conduit 716 between the first substrate 301 and the second substrate 706, which is a housing member and, in particular, the fascia 114 of the electronic device (100) in this example.

In one or more embodiments, the acoustic port 705, acoustic duct 704, and acoustic port 303 may be formed in second substrate 706, base section 401, and first substrate 301 which are compound in nature composed of one or more laminated layers. Each of these layers can have different sized or shaped bores creating ducts and ports that are not constant shape or diameter along their length. In these embodiments, the acoustic port 705, acoustic duct 704, and acoustic port 303 would be comprised of stepped shapes along their length.

In one or more embodiments, the venting section 402 initially breaches 703 the acoustic duct 704 at an initial breach pressure threshold within a predefined pressure threshold window. Turning briefly to FIG. 8, illustrated therein is one example of such a predefined pressure threshold window 801.

FIG. 8 illustrates a graph 800 of the amount of deformation 802, shown illustratively as an amount of deflection of the arcuate leg (505) of the venting section (402), as a function of the pressure 712 within the acoustic duct 704. Also shown in FIG. 8 is the predefined pressure threshold window 801.

In one or more embodiments, the predefined pressure threshold window 801 is defined by a lower pressure threshold boundary 803 and an upper pressure threshold boundary 804. In this illustrative example, the lower pressure threshold boundary 803 is about 20 Pascals, while the upper pressure threshold boundary 804 is about 1000 Pascals. This range of pressure thresholds allows for the microphone (707) of the microphone assembly (300) to function properly, for example, at nightclubs and bars with loud music without clipping, while preventing damage to the diaphragm (308), back plate, or other microphone components from the pressure 712.

It should be noted that other lower pressure threshold boundaries and upper pressure threshold boundaries can be used as well. In another embodiment, the lower pressure threshold boundary 803 is about 50 Pascals, while the upper pressure threshold boundary 804 is about 750 Pascals. In still another embodiment, the lower pressure threshold boundary 803 is about 100 Pascals, while the upper pressure threshold boundary 804 is about 500 Pascals. Other boundaries for the predefined pressure threshold window 801 will be obvious to those of ordinary skill in the art having the benefit of this disclosure.

In one or more embodiments, the venting section (402) of the pressure relief device (400) initially breaches the acoustic duct (704) at an initial breach pressure threshold 805, which is about 300 Pascals in this illustration. Thus, in this illustration, the venting section (402) of the pressure relief device (400) initially breaches the acoustic duct 704 when the pressure 712 exceeds a predefined pressure threshold equivalent to the initial breach pressure threshold 805, which is about 300 Pascals, but could be designed to be any pressure threshold within the predefined pressure threshold window 801.

Thereafter, as shown in FIG. 8, the venting section (402) continues breaching (703) the acoustic duct 704 until the pressure 712 in the acoustic duct (704) falls below the initial breach pressure threshold 805. This continued breaching (703) occurs even when the pressure 712 exceeds the upper pressure threshold boundary 804, thereby preventing mechanical damage to the microphone (707) from the pressure 712.

Turning now back to FIG. 7, once the pressure 712 falls below this initial breach pressure threshold 805, the deformation of the arcuate leg 505 ceases, with the convex surface 508 of the arcuate leg 505 once again abutting the first substrate 301. This functions to close the other acoustic conduit 716, thereby again resealing the acoustic duct 704 such that the microphone 707 can once again receive acoustic energy 711 from the acoustic port 705 through the acoustic duct 704.

Thus, as illustrated and described with reference to FIGS. 7-8, in one or more embodiments the venting section 402 initially breaches when the pressure 712 in the acoustic port 705 is within a predefined pressure threshold window 801. In one or more embodiments, the predefined pressure window 801 has a lower pressure threshold boundary 803 of about 20 Pascals, and an upper pressure threshold boundary 804 of about 1000 Pascals. In one or more embodiments, the venting section 402 initially breaches at an initial breach pressure threshold 805 within this predefined pressure threshold window 801, and continues breaching 703 the acoustic duct 704 until the pressure 712 within the acoustic duct 704 falls below this initial breach pressure threshold 805, thereby preventing mechanical damage to the microphone 707 from the aerodynamic-based pressure pulse induced in the acoustic duct 704, which can result when the electronic device (100) is dropped on an impact surface 713.

Turning now to FIGS. 9-10, illustrated therein is another pressure relief device 900 configured in accordance with one or more embodiments of the disclosure. FIG. 9 illustrates a perspective view of the pressure relief device 900, while FIG. 10 illustrates a sectional view of the pressure relief device 900.

As with the pressure relief device (400) of FIGS. 4-5, in this embodiment the pressure relief device 900 comprises a base section 901 and a venting section 902. The base section 901 is configured as a cylinder having a first major face 903 and a second major face 904. A minor face 905 extends between an edge of the first major face 903 and a chamfer 907 that tapers inward toward an edge of the second major face 904. In this illustrative embodiment, the first major face 903 and the second major face 904 are substantially planar, while the minor face 905 defines a perimeter of the base section 901.

In one or more embodiments, the venting section 902 extends distally away from a major face 904 of the base section 901. In this illustrative embodiment, the base section 901 and the venting section 902 are manufactured as a singular, unitary part from an elastomeric material such as a thermoplastic elastomer.

In one or more embodiments, the base section 901 defines a bore 906. In one or more embodiments the bore 906 extends from the base section 901 through the venting section 902. In this illustrative embodiment, the diameter 1001 of the bore 906 within the base section 901 is narrower than is the diameter 1002 of the bore 906 within the venting section 902. In one or more embodiments, this is due to the fact that the venting section 902 couples to the base section 901 at a periphery 1003 of the bore 906. The venting section 902 then extends distally away from the base section 901 in a direction that flares outward from the periphery 1003 of the bore 906. This causes the diameter 1002 of the bore 906 within the venting section 902 to expand as the venting section 902 extends distally away from the major face 904 of the base section 901.

In the illustrative embodiment of FIGS. 9-10, the venting section 902 defines a substantially straight leg 1004 that is sometimes referred to as a "wiper" leg. As with the embodiment of FIG. 7, in one or more embodiments the pressure relief device 900 can be situated between a first substrate, which can be a housing member, printed circuit board, or other substrate, and a second substrate, which can be a printed circuit board, can, or other substrate. Where so situated, the first major face 903 abuts the first substrate, while the end 1005 of the substantially straight leg 1004 abuts the second substrate. The pressure relief device 900 of FIGS. 9-10 can then function in a similar manner to the pressure relief device (400) of FIG. 7, with the venting section 902 initially breaching an acoustic duct when the pressure within the acoustic duct exceeds a predefined pressure threshold within a predefined pressure threshold window.

Figure 11:
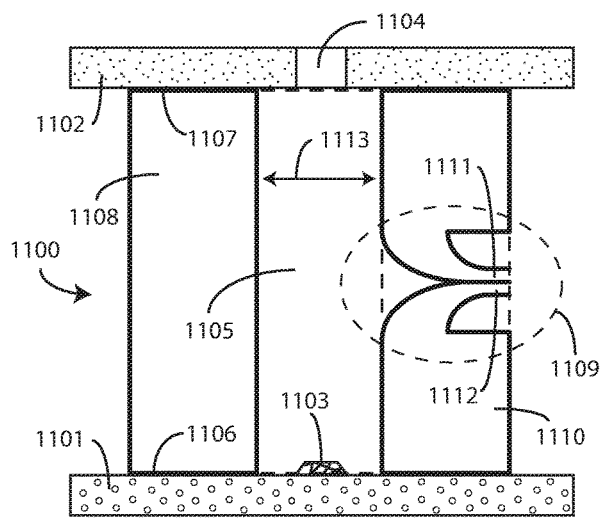
FIG. 11 illustrates another acoustic assembly in accordance with one or more embodiments of the disclosure.

Turning now to FIG. 11, illustrated therein is another pressure relief device 1100 configured in accordance with one or more embodiments of the disclosure. FIG. 11 illustrates a sectional view of the pressure relief device 1100 when situated between a first substrate 1101 and a second substrate 1102.

As shown in FIG. 11, a microphone 1103 is coupled to the first substrate 1101. In this example, the microphone 1103 is coupled to the topside of the first substrate 1101. Accordingly, there is no need for the first substrate to define an acoustic port. However, the second substrate 1102 defines an acoustic port 1104 through which acoustic energy can enter.

The pressure relief device 1100 is situated between the first substrate 1101 and the second substrate 1102. The pressure relief device 1100 comprises a bore 1105 defining an acoustic duct through which the microphone 1103 receives acoustic energy from the acoustic port 1104. In this embodiment, the bore 1105 has a diameter 1113 that remains constant along the length of the pressure relief device 1100.

In this illustrative embodiment, the pressure relief device 1100 comprises a first surface 1106 and a second surface 1107. As shown in FIG. 11, the first surface 1106 abuts the first substrate 1101, while the second surface 1107 abuts the second substrate 1102. At least a third surface 1108 extends from the first surface 1106 to the second surface 1107.

As before, the pressure relief device 1100 comprises a venting section 1109. The venting section 1109 is configured to breach the acoustic duct defined by the bore 1105 when a pressure within the acoustic duct exceeds a predefined pressure threshold. In contrast to the embodiment of FIGS. 4-5 and FIGS. 9-10, which included a base section and a venting section extending distally from a major face of the base section, in the embodiment of FIG. 11 the venting section 1109 is situated along the third surface 1108 between the first surface 1106 and the second surface 1107.

In this illustrative embodiment, the venting section 1109 comprises a sidewall 1110 of the pressure relief device 1100 defining a pair of abutting flaps 1111,1112. In one or more embodiments, the pair of abutting flaps 1111,1112 initially separate to breach the acoustic duct when the pressure within the acoustic duct defined by the bore 1105 exceeds a predefined pressure threshold. In one or more embodiments, the pair of abutting flaps 1111,1112 initially separate to breach the acoustic duct when the pressure within the acoustic duct defined by the bore 1105 falls within a predefined pressure threshold window, such as that shown in FIG. 8. In one or more embodiments, the pair of abutting flaps 1111,1112 continue to breach the acoustic duct even when the pressure within the acoustic duct exceeds an upper pressure threshold boundary of the predefined pressure threshold window. In one or more embodiments, the pair of abutting flaps 1111,1112 do not close to reseal the acoustic duct until the pressure within the acoustic duct falls below the initial breach pressure threshold at which they opened, thereby preventing mechanical damage to the microphone 1103 from the pressure.

Figure 12:
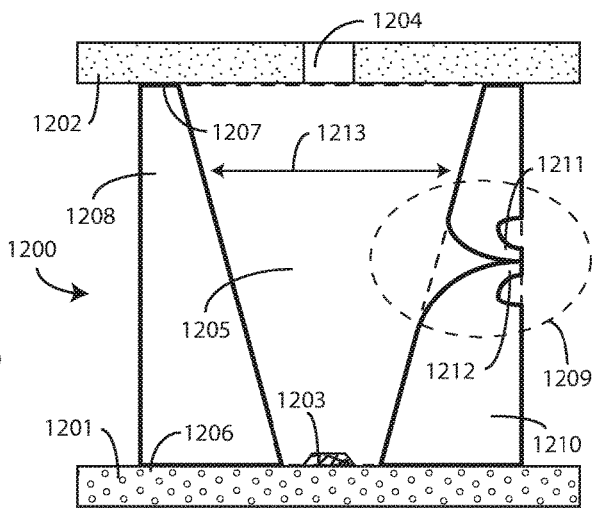
FIG. 12 illustrates still another acoustic assembly in accordance with one or more embodiments of the disclosure.

Turning now to FIG. 12, illustrated therein is another pressure relief device 1200 configured in accordance with one or more embodiments of the disclosure. FIG. 12 illustrates a sectional view of the pressure relief device 1200 when situated between a first substrate 1201 and a second substrate 1202.

As with FIG. 11, in FIG. 12 a microphone 1203 is coupled to the first substrate 1201. The second substrate 1202 defines an acoustic port 1204. The pressure relief device 1200 comprises a bore 1205 defining an acoustic duct through which the microphone 1203 receives acoustic energy from the acoustic port 1204. In this embodiment, the bore 1205 has a diameter 1213 that gets narrower as the pressure relief device 1100 extends from the second substrate 1202 to the first substrate 1101, thereby funneling acoustic energy toward the microphone 1203.

The pressure relief device 1200 comprises a first surface 1206 abutting the first substrate 1201. The pressure relief device 1200 also includes a second surface 1207 that abuts the second substrate 1202. At least a third surface 1208 extends from the first surface 1206 to the second surface 1207.

As with previous embodiments, the pressure relief device 1200 comprises a venting section 1209 that is configured to breach the acoustic duct defined by the bore 1205 when a pressure within the acoustic duct exceeds a predefined pressure threshold. As with the embodiment of FIG. 11, in this illustrative embodiment the venting section 1209 is situated along the third surface 1208 between the first surface 1206 and the second surface 1207.

In this illustrative embodiment, the venting section 1209 comprises a sidewall 1210 of the pressure relief device 1200 defining a pair of abutting flaps 1211,1212. In one or more embodiments, the pair of abutting flaps 1211,1212 initially separate to breach the acoustic duct when the pressure within the acoustic duct defined by the bore 1205 exceeds a predefined pressure threshold. In one or more embodiments, the pair of abutting flaps 1211,1212 initially separate to breach the acoustic duct when the pressure within the acoustic duct defined by the bore 1205 falls within a predefined pressure threshold window, as previously described, thereby preventing mechanical damage to the microphone 1203 from excessive pressure occurring within the acoustic duct.

Figure 13:
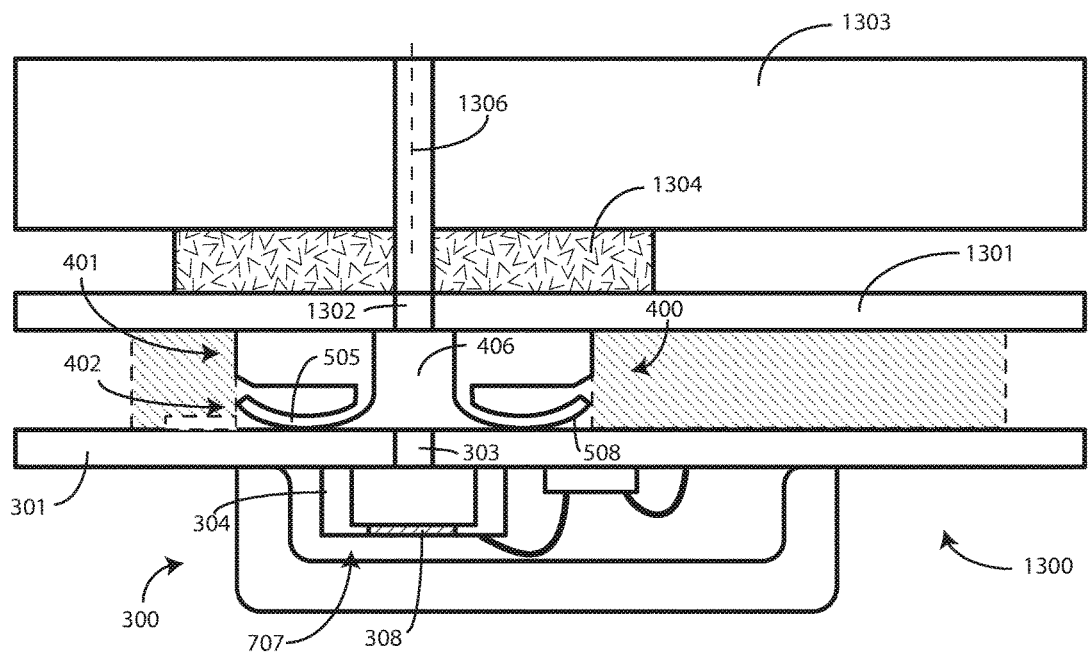
FIG. 13 illustrates yet another explanatory acoustic assembly in accordance with one or more embodiments of the disclosure.

Turning now to FIG. 13, illustrated therein is yet another acoustic assembly 1300 configured in accordance with one or more embodiments of the disclosure. As shown in FIG. 13, a microphone assembly 300 including a microphone 707 having a MEMS die 304 comprising a diaphragm 308 and a back plate is coupled to a first substrate 301. In this example, the substrate 301 defines an acoustic port 303.

A second substrate 1301 then defines another acoustic port 1302. In this illustrative embodiment the second substrate 1301 comprises a printed wiring board that is separated from a housing member of an electronic device by a grommet 1304. A housing member 1303 then defines a third acoustic port 1306. The housing member 1303 is separated from the second substrate 1301 by the grommet 1304 in this embodiment.

The pressure relief device 400 of FIGS. 4-5 above is then situated between the first substrate 301 and the second substrate 1301, with the first substrate 301 situated between the microphone 707 of the microphone assembly 300 and the pressure relief device 400. The pressure relief device 400 comprises a bore 406 that surrounds a portion of the acoustic conduit between the acoustic duct 1306 defined by the housing member 1303, which is separated from the second substrate 1301 by the grommet 1304, and the acoustic duct 303 defined by the first substrate 301, through which the microphone 707 of the microphone assembly 300 receives acoustic energy.

As before, in this embodiment the pressure relief device 400 includes a base section 401 and a venting section 402 extending distally away from the base section 401. The venting section 402 of this embodiment defines an arcuate leg 505. The arcuate leg 505 defines a convex surface 508 that abuts the first substrate 301.

When the pressure within the acoustic duct 1306 exceeds a predefined pressure threshold, which can be between 20 and 1000 Pascals in one or more embodiments, the venting section 402 breaches the portion of the acoustic conduit between the acoustic duct 1306 defined by the housing member 1303 and the acoustic duct 303 defined by the first substrate 301 by deforming at least a portion of the venting section 402 situated between the first substrate 301 and the second substrate 1301. For example, the arcuate leg 505 can deform so that a portion of the convex surface 508 of the arcuate leg 505 separates from the first substrate 301 to allow air, gas or other fluids to escape the portion of the acoustic conduit between the acoustic duct 1306 defined by the housing member 1303 and the acoustic duct 303 defined by the first substrate 301. This air, gas, or other fluid then passes into the interior of the electronic device between the first substrate 301 and the second substrate 1301 through a second acoustic conduit established between the first substrate 301 and the second substrate 1301.

In one or more embodiments, the venting section 402 continues breaching the portion of the acoustic conduit between the acoustic duct 1306 defined by the housing member 1303 and the acoustic duct 303 defined by the first substrate 301 until the pressure in the acoustic duct 1306 falls below the initial breach pressure threshold at which the initial breaching occurred. This continued breaching occurs to prevent mechanical damage to the microphone 707 from the pressure.

Figure 14:
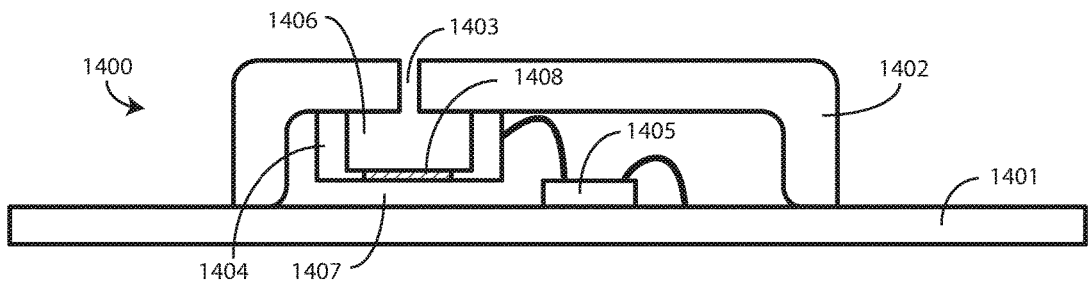
FIG. 14 illustrates another prior art microphone assembly.

Turning now to FIG. 14, illustrated therein is another prior art microphone assembly 1400 with which a pressure relief device can be used in accordance with embodiments of the disclosure. In contrast to the prior art microphone assembly (300) of FIG. 3, which was a "bottom mount" microphone assembly in which the substrate (301) defined an acoustic port (303), the prior art microphone assembly 1400 of FIG. 14 is a "top mount" microphone assembly where the can 1402 defines an acoustic port 1403. As with the embodiment of FIG. 3, the prior art microphone assembly 1400 of FIG. 14 employs a MEMS microphone.

In the illustrative embodiment of FIG. 14, the microphone assembly 1400 comprises a substrate 1401 and a can 1402. The can 1402 defines a substrate, one example of which is a metallized substrate, of the microphone assembly 1400. The can 1402 can be soldered, epoxied, or otherwise coupled to the substrate 1401, which comprises a printed wiring board in this embodiment.

In the illustrative embodiment of FIG. 14, the can 1402 defines an acoustic port 1403. In one or more embodiments, the acoustic port 1403 has a diameter of about 0.25 millimeters. The acoustic port 1403 allows acoustic energy to pass through the can 1402 and to the microphone.

Coupled to the can 1402 is a MEMS die 1404. Coupled to the substrate 1401 is an application specific integrated circuit 1405. Wires or other electrical conductors can be used to couple the components together, as previously described. When the MEMS die 1404 is coupled to the can 1402, an acoustic front volume 1406 and an acoustic back volume 1407 are defined about the diaphragm 1408 of the microphone assembly 1400.

Figure 15:
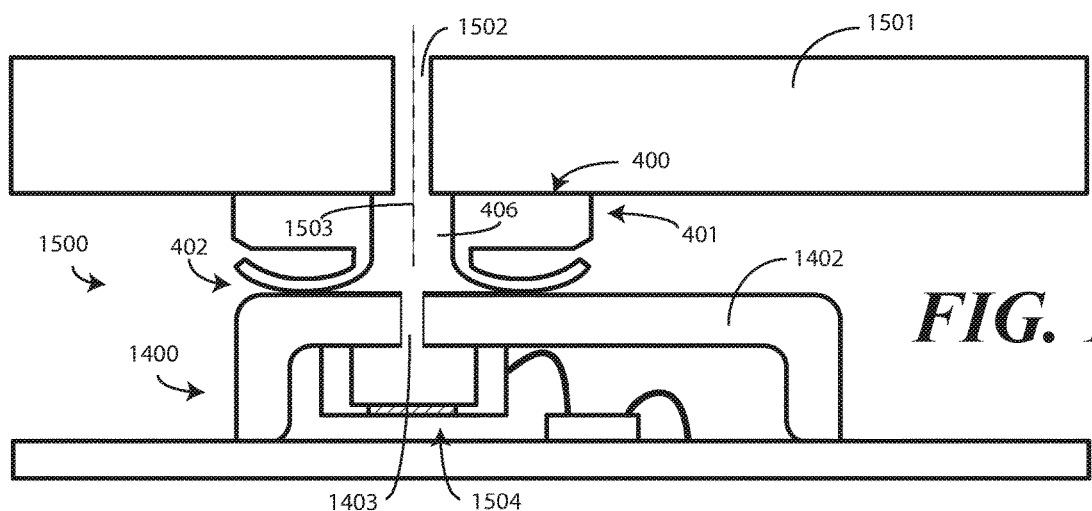
FIG. 15 illustrates still another explanatory acoustic assembly in accordance with one or more embodiments of the disclosure.

Turning now to FIG. 15, illustrated therein is an acoustic assembly 1500 using the microphone assembly 1400 of FIG. 14 in accordance with one or more embodiments of the disclosure. In this example, the can 1402 of the microphone assembly 1400 functions as a first substrate and defines a first acoustic port 1403. A housing member 1501 then functions as a second substrate and defines a second acoustic port 1502.

The pressure relief device 400 of FIGS. 4-5 above is situated between the first substrate and the second substrate. The pressure relief device 400 comprises a bore 406 that defines an acoustic duct 1503 through which the microphone 1504 of the microphone assembly 1400 receives acoustic energy from the acoustic port 1502 of the second substrate.

When the pressure within the acoustic duct 1503 exceeds a predefined pressure threshold, the venting section 402 of the pressure relief device 400 breaches the acoustic duct 1503 by deforming at least a portion of the venting section 402 situated between the first substrate and the second substrate. Air, gas, or other fluid causing the pressure then passes into the interior of the electronic device between the first substrate and the second substrate through a second acoustic conduit established between the first substrate and the second substrate. In one or more embodiments, the venting section 402 continues breaching the acoustic duct 1503 until the pressure in the acoustic duct 1503 falls below the initial breach pressure threshold at which the initial breaching occurred. This continued breaching occurs to prevent mechanical damage to the microphone 1504 from the pressure.

FIG. 15 depicts the outermost acoustic port 1502 as being smaller in diameter than the acoustic duct 1503 in the pressure relief device 400. However, it should be understood that embodiments of the disclosure are not so limited. Embodiments of the disclosure can also be used with an acoustic port 1502 with a diameter the same size as the acoustic duct 1503 in the pressure relief device 400 or an acoustic port 1502 with a diameter larger the acoustic duct 1503 in the pressure relief device 400. The same is true for any of the other embodiments previously discussed in this document.

Figure 16:
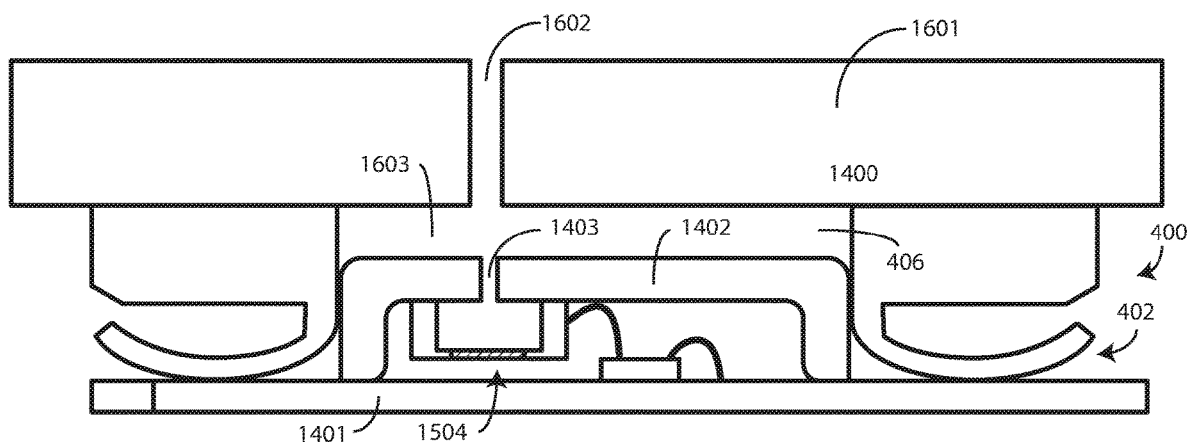
FIG. 16 illustrates yet another explanatory acoustic assembly in accordance with one or more embodiments of the disclosure.

Turning now to FIG. 16, illustrated therein is another acoustic assembly 1600 using the microphone assembly 1400 of FIG. 14 in accordance with one or more embodiments of the disclosure. In this example, the can 1402 of the microphone assembly 1400 is coupled to a first substrate 1401 and defines a first acoustic port 1403. A housing member 1601 then defines a second substrate and defines a second acoustic port 1602.

The pressure relief device 400 of FIGS. 4-5 above is situated between the first substrate and the second substrate. The pressure relief device 400 comprises a bore 406 that defines an acoustic duct 1603 through which the microphone 1504 of the microphone assembly 1400 receives acoustic energy from the acoustic port 1602 of the second substrate. In this embodiment, the can 1402 of the microphone assembly 1400 situates within the bore 406, with the pressure relief device 400 surrounding the microphone assembly 1400.

When the pressure within the acoustic duct 1603 exceeds a predefined pressure threshold, the venting section 402 of the pressure relief device 400 breaches the acoustic duct 1603 by deforming at least a portion of the venting section 402 situated between the first substrate and the second substrate. Air, gas, or other fluid causing the pressure then passes into the interior of the electronic device between the first substrate and the second substrate through a second acoustic conduit established between the first substrate and the second substrate. In one or more embodiments, the venting section 402 continues breaching the acoustic duct 1603 until the pressure in the acoustic duct 1603 falls below the initial breach pressure threshold at which the initial breaching occurred. This continued breaching occurs to prevent mechanical damage to the microphone 1504 from the pressure.

Figure 17:
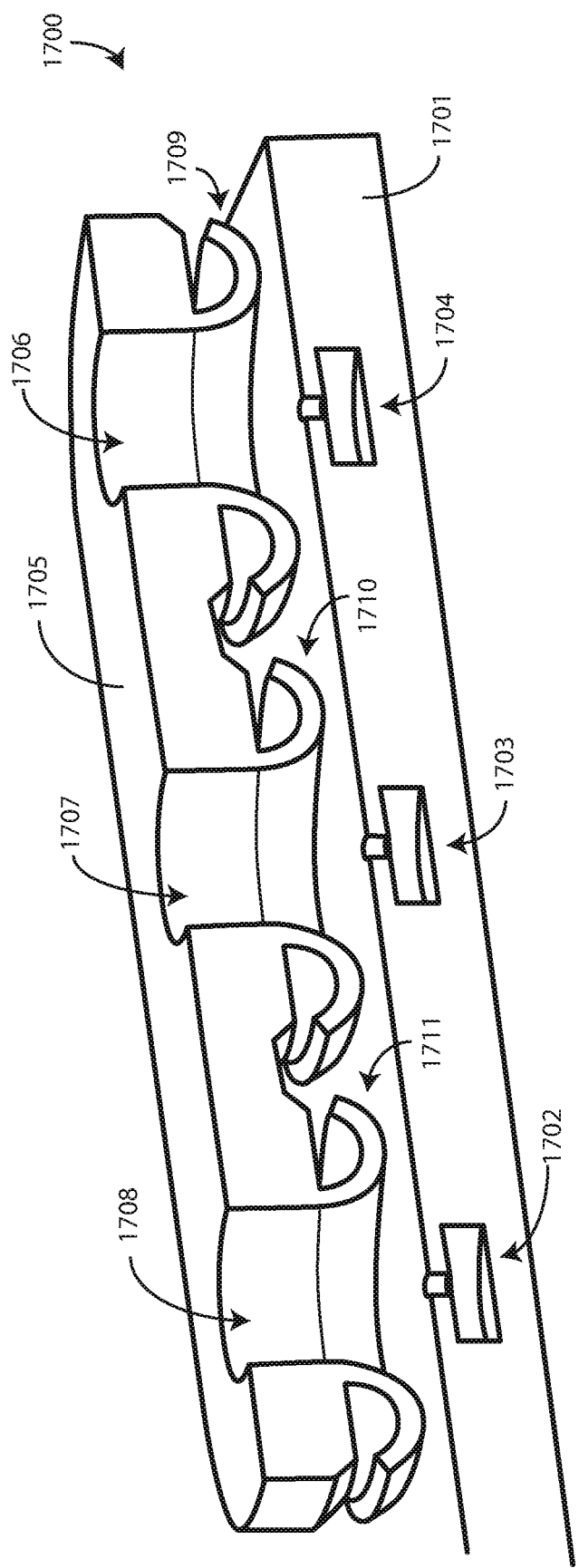
FIG. 17 illustrates another explanatory acoustic assembly in accordance with one or more embodiments of the disclosure.

Turning now to FIG. 17, illustrated therein is an alternate pressure relief device 1700 configured in accordance with one or more embodiments of the disclosure. To this point, the previous pressure relief devices have been described in a singular context with one pressure relief device being associated with one microphone. However, it should be understood that embodiments of the disclosure are not so limited. Embodiments of the disclosure can also be used with an array 1701 of microphones 1702,1703,1704 as well.

In one embodiment, single pressure relief devices, which could be any of those described above with reference to FIGS. 4-5, FIGS. 9-10, FIG. 11, or FIG. 12, could be used with each microphone 1702,1703,1704 on a one-to-one basis. However, in the illustrative embodiment of FIG. 17 a single pressure relief device 1700 is used with the array 1701 of microphones 1702,1703,1704.

In the illustrative embodiment of FIG. 17, the pressure relief device 1700 comprises a single base member 1705. The single base member 1705 comprises a plurality of bores 1706,1707,1708 and a plurality of venting sections 1709, 1710,1711. Each bore 1706,1707,1708 defines an acoustic duct for each microphone 1702,1703,1704. When the pressure within any one acoustic duct exceeds a predefined pressure threshold, the corresponding venting section 1709, 1710,1711 breaches the acoustic duct by deforming at least a portion of the venting section 1709,1710,1711 situated between the first substrate and the second substrate, as previously described. While FIG. 17 illustrates all three bores oriented to abut a same second substrate, it should be understood that embodiments of the disclosure are not so limited. In alternative embodiments, each bore could abut a substrate that encompasses a separate surface of the phone, such as front, back, and bottom.

Figure 18:
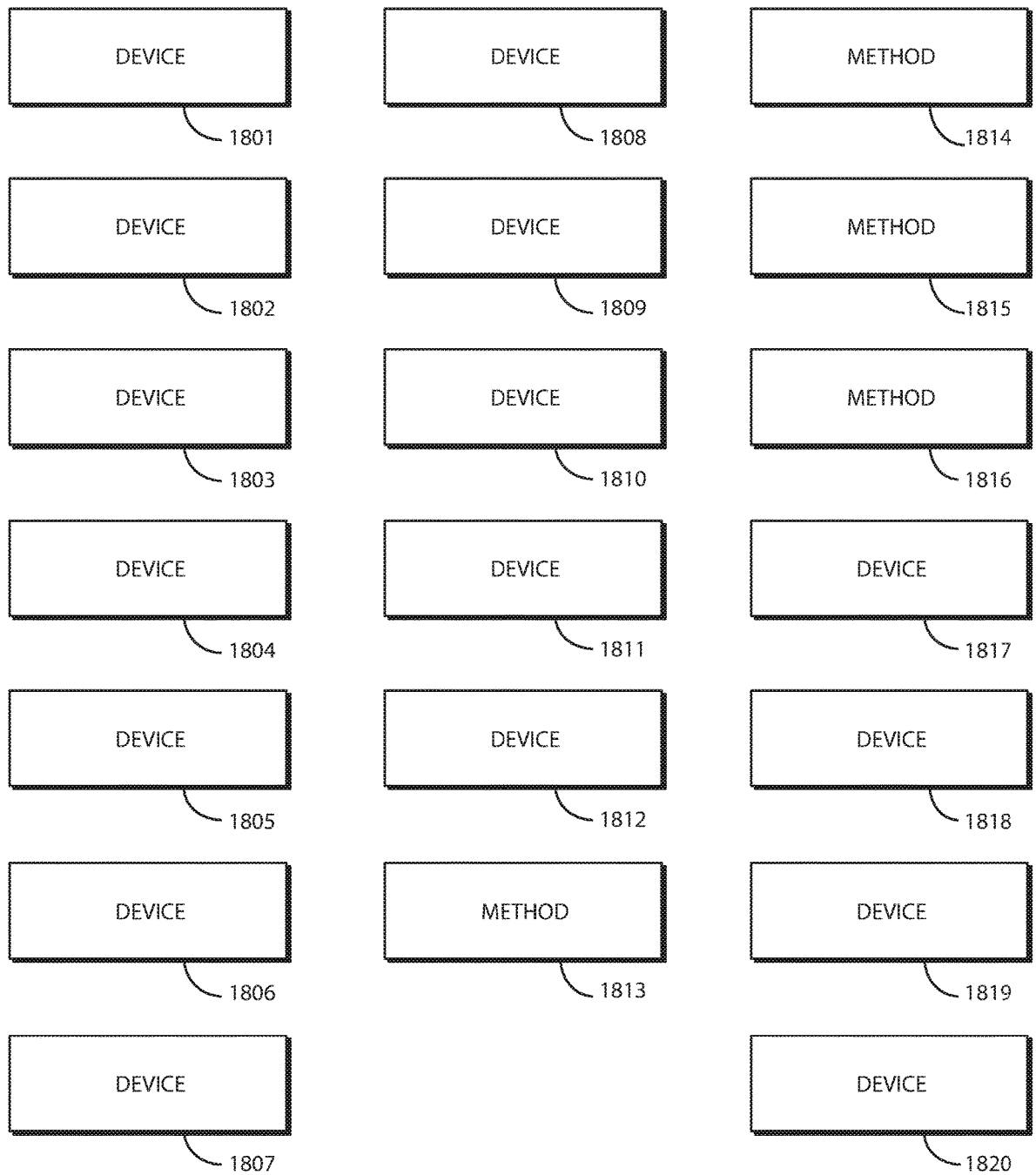
FIG. 18 illustrates various embodiments of the disclosure.

Turning now to FIG. 18, illustrated therein are various embodiments of the disclosure. At 1801, an electronic device comprises a microphone coupled to a first substrate. At 1801, the electronic device comprises a second substrate defining an acoustic port. At 1801, the electronic device comprises a pressure relief device situated between the first substrate and the second substrate.

At 1801, the pressure relief device comprises a bore. At 1801, the bore defines an acoustic duct through which the microphone receives acoustic energy from the acoustic port. At 1801, the pressure relief device comprises a venting section. At 1801, the venting section breaches the acoustic duct when a pressure within the acoustic duct exceeds a predefined pressure threshold.

At 1802, the predefined pressure threshold of 1801 is between 20 and 1000 Pascals, inclusive. At 1803, the first substrate of 1803 is situated between the microphone and the pressure relief device. At 1803, the first substrate defines another acoustic port.

At 1804, the first substrate of 1803 comprises a can covering the microphone. At 1805, the second substrate of 1803 comprises a housing member of the electronic device. At 1806, the housing member of 1805 defines a major face of the electronic device. At 1807, the housing member of 1806 comprises a substantially flat fascia of the electronic device.

At 1808, the pressure relief device of 1802 is manufactured from an elastomeric material.

At 1808, the first substrate and the second substrate of 1802 apply a loading force to compress the pressure relief device by a predefined compression distance.

At 1809, the pressure relief device of 1808 comprises a first surface abutting the first substrate, a second surface abutting the second substrate, and at least a third surface extending from the first surface to the second surface. At 1809, the venting section is situated on the third surface.

At 1810, the pressure relief device of 1809 further comprises a base section. At 1810, the venting section extends distally away from the base section.

At 1811, the bore of 1810 is narrower within the base section than within the venting section. At 1812, the venting section of 1810 defines an arcuate leg.

At 1813, a method in an electronic device comprises initially breaching an acoustic duct defined by a bore of a pressure relief device situated between an acoustic port in a first substrate and a microphone coupled to a second substrate when a pressure within the acoustic duct falls within a predefined pressure threshold window. At 1814, the method of 1813 further comprises continuing the breaching when the pressure exceeds an upper pressure threshold boundary of the predefined pressure threshold window.

At 1815, the breaching of 1814 comprises deforming at least a portion of a venting section of the pressure relief device situated between the first substrate and the second substrate. At 1816, the deforming the at least a portion of the venting section of 1815 comprises deforming an leg of the pressure relief device extending distally away from a base section of the pressure relief device.

At 1817, an electronic device comprises a housing member defining an acoustic port. At 1817, the housing member comprises a substrate coupled to a microphone. At 1817, the housing member comprises a pressure relief device, biased between the substrate and the housing member. At 1817, the pressure relief device defines a bore establishing an acoustic duct between the acoustic port and the microphone.

At 1817, the pressure relief device comprises a venting section. At 1817, the venting section initially breaches the acoustic duct when a pressure within the acoustic duct is within a predefined pressure threshold window.

At 1818, the venting section of 1817 comprises a sidewall defining a pair of abutting vent flaps that initially separate when the pressure within the acoustic duct falls within the predefined pressure threshold window. At 1819, the pressure relief device of 1817 further comprises a base section coupled to the venting section. At 1819, the bore of 1817 is narrower within the base section than within the venting section and the venting section is coupled to the base section at a periphery of the bore.

At 1820, the venting section of 1817 initially breaches the acoustic duct at an initial breach pressure threshold within the predefined pressure threshold window. At 1820, the venting section of 1817 continues breaching the acoustic duct until the pressure falls below the initial breach pressure threshold. At 1820, this breaching prevents mechanical damage to the microphone from the pressure.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

For example, embodiments of the disclosure described above provide a pressure relief device that defines a bore providing a flow passage acting as a conduit for an audio path between an external acoustic port and a microphone. In one or more embodiments, the pressure relief device provides a flexible/elastomeric seal between a first substrate and a second substrate. In one or more embodiments, the pressure relief device includes a venting section that provides an airtight seal at all interfaces under normal operating conditions, but that is structurally compliant to flex/deflect/open above a preset threshold pressure. The venting section of the pressure relief device returns to its original design geometry when pressure drops below threshold value. In one or more embodiments, the venting section of the pressure relief device can be located at the microphone interface, against a substrate, against a housing member, or combinations thereof.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a microphone coupled to a first substrate;
   a second substrate defining an acoustic port; and
   a pressure relief device situated between the first substrate and the second substrate;
   the pressure relief device comprising:
      a bore defining an acoustic duct through which the microphone receives acoustic energy from the acoustic port; and
      a venting section, the venting section breaching the acoustic duct when a pressure within the acoustic duct exceeds a predefined pressure threshold;
   the first substrate situated between the microphone and the pressure relief device and defining another acoustic port.

2. The electronic device of claim 1, the predefined pressure threshold between 20 and 1000 Pascals, inclusive.

3. The electronic device of claim 1, the first substrate comprising a can covering the microphone.

4. The electronic device of claim 1, the second substrate comprising a housing member of the electronic device.

5. The electronic device of claim 4, the housing member defining a major face of the electronic device.

6. The electronic device of claim 5, the housing member comprising a substantially flat fascia of the electronic device.

7. The electronic device of claim 1, the pressure relief device manufactured from an elastomeric material, the first substrate and the second substrate applying a loading force to compress the pressure relief device by a predefined compression distance.

8. The electronic device of claim 7, the pressure relief device comprising a first surface abutting the first substrate, a second surface abutting the second substrate, and at least a third surface extending from the first surface to the second surface, the venting section situated on the third surface.

9. The electronic device of claim 8, the pressure relief device further comprising a base section, the venting section extending distally away from the base section.

10. The electronic device of claim 9, the bore narrower within the base section than within the venting section.

11. The electronic device of claim 9, the venting section defining an arcuate leg.

12. An electronic device, comprising:
    a housing member defining an acoustic port;
    a substrate coupled to a microphone; and
    a pressure relief device, biased between the substrate and the housing member, and defining a bore establishing an acoustic duct between the acoustic port and the microphone;
    the pressure relief device comprising a venting section initially breaching the acoustic duct when a pressure within the acoustic duct is within a predefined pressure threshold window and a base section coupled to the venting section, wherein the bore is narrower within the base section than within the venting section and the venting section is coupled to the base section at a periphery of the bore.

13. The electronic device of claim 12, the venting section comprising a sidewall defining a pair of abutting vent flaps that initially separate when the pressure within the acoustic duct falls within the predefined pressure threshold window.

14. The electronic device of claim 12, the pressure relief device ceasing the breaching of the acoustic duct when the pressure within the acoustic duct falls below the predefined pressure threshold window.

15. The electronic device of claim 12, the venting section initially breaching the acoustic duct at an initial breach pressure threshold within the predefined pressure threshold window, the venting section continuing breaching the acoustic duct until the pressure falls below the initial breach pressure threshold, thereby preventing mechanical damage to the microphone from the pressure.

16. An electronic device, comprising:
    a microphone coupled to a first substrate;
    a second substrate defining an acoustic port; and
    a pressure relief device manufactured from an elastomeric material and situated between the first substrate and the second substrate with the first substrate and the second substrate applying a loading force to compress the pressure relief device by a predefined compression distance;
    the pressure relief device comprising:
       a bore defining an acoustic duct through which the microphone receives acoustic energy from the acoustic port; and
       a venting section, the venting section breaching the acoustic duct when a pressure within the acoustic duct exceeds a predefined pressure threshold.

17. The electronic device of claim 16, the pressure relief device comprising a first surface abutting the first substrate, a second surface abutting the second substrate, and at least a third surface extending from the first surface to the second surface, the venting section situated on the third surface.

18. The electronic device of claim 17, the pressure relief device further comprising a base section, the venting section extending distally away from the base section.

19. The electronic device of claim 18, the bore narrower within the base section than within the venting section.

20. The electronic device of claim 18, the venting section defining an arcuate leg.

\* \* \* \* \*